United States Patent
Li et al.

(10) Patent No.: US 9,786,502 B2
(45) Date of Patent: Oct. 10, 2017

(54) METHOD FOR FORMING FIN STRUCTURES FOR NON-PLANAR SEMICONDUCTOR DEVICE

(71) Applicant: UNITED MICROELECTRONICS CORP., Hsin-Chu (TW)

(72) Inventors: Kuan-Hsien Li, Tainan (TW); Rai-Min Huang, Taipei (TW); I-Ming Tseng, Kaohsiung (TW); Wen-An Liang, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/067,157

(22) Filed: Mar. 10, 2016

(65) Prior Publication Data
US 2017/0263454 A1    Sep. 14, 2017

(51) Int. Cl.
*H01L 21/033*    (2006.01)
*H01L 21/8234*    (2006.01)

(52) U.S. Cl.
CPC .. *H01L 21/0337* (2013.01); *H01L 21/823431* (2013.01)

(58) Field of Classification Search
None
See application file for complete search history.

(56) References Cited

U.S. PATENT DOCUMENTS

| | | |
|---|---|---|
| 8,513,131 B2 | 8/2013 | Cai et al. |
| 9,209,038 B2 | 12/2015 | Cantone et al. |
| 2013/0307088 A1* | 11/2013 | Yang .............. H01L 29/66545 257/401 |
| 2015/0236133 A1* | 8/2015 | Singh .............. H01L 29/66795 257/401 |

OTHER PUBLICATIONS

Feng, Title of Invention: Method for Fabricating Semiconductor Device, U.S. Appl. No. 14/864,852, filed Sep. 24, 2015.

\* cited by examiner

*Primary Examiner* — Jay C Chang
(74) *Attorney, Agent, or Firm* — Winston Hsu (57) ABSTRACT

A method for forming fin structure includes following steps. A substrate is provided. A first mandrel and a plurality of second mandrels are formed on the substrate simultaneously. A plurality of spacers are respectively formed on sidewalls of the first mandrel and the second mandrels and followed by removing the first mandrel and the second mandrels to form a first spacer pattern and a plurality of second spacer patterns. Then the substrate is etched to simultaneously form at least a first fin and a plurality of second fins on the substrate with the first spacer pattern and the second spacer patterns serving as an etching mask. At least one of the second fins is immediately next to the first fin, and a fin width of the first fin is larger than a fin width of the second fins. Then, the second fins are removed from the substrate.

10 Claims, 6 Drawing Sheets

METHOD FOR FORMING FIN STRUCTURES FOR NON-PLANAR SEMICONDUCTOR DEVICE

BACKGROUND OF THE INVENTION

1. Field of the Invention

The present invention relates to a method for forming fin structures for non-planar semiconductor device, and more particularly, to a method for forming fin structures for non-planar semiconductor device using sidewall image transfer (hereinafter abbreviated as SIT) technique.

2. Description of the Prior Art

Conventional planar metal-oxide-semiconductor (MOS) transistor has difficulty when scaling down to 65 nm and below. Therefore the non-planar transistor technology such as Fin Field effect transistor (FinFET) technology that allows smaller size and higher performance is developed to replace the planar MOS transistor.

The FinFET device is conventionally formed by: First a silicon layer of a substrate is patterned to form fin structures (not shown) by a proper etching process. Then, an insulating layer surrounding lower portions of the fin structures is formed and followed by forming a gate covering a portion of the insulating layer and top portions of the fin structures. Immediately next, dopants are introduced and annealing treatments are performed to form source/drain in the fin structures not covered by the gate. Since the manufacturing processes of the FinFET device are similar to the traditional logic device processes, it provides superior process compatibility. More important, since the FinFET device increases the overlapping area between the gate and the fin structures, the channel region is more effectively controlled. This therefore reduces drain-induced barrier lowering (DIBL) effect and short channel effect, and the current between the source and the drain is increased.

However, the FinFET device still faces many problems. It is found that fin widths of fin structures in different regions are made different after fabrication processing, though it is supposed to be identical. For example, fin width is reduced due to silicon loss in thermal treatment, and such problem is exacerbated in iso region(s). It is well-known that the fin width is a key factor for device performance, therefore fin width control is important. Accordingly, method for manufacturing fin structures with consistent fin widths is still in need.

SUMMARY OF THE INVENTION

According to an aspect of the present invention, a method for forming fin structures is provided. The method include following steps. A substrate is provided. A first mandrel and a plurality of second mandrels are formed on the substrate simultaneously. A spacing width between the first mandrel and one of the second mandrels immediately next to the first mandrel on one side is larger than a spacing width between the second mandrels, and a width of the first mandrel is larger than a width of the second mandrels. Next, a plurality of spacers are respectively formed on sidewalls of the first mandrel and the second mandrels and followed by removing the first mandrel and the second mandrels to form a first spacer pattern and a plurality of second spacer patterns. Then, the substrate is etched to simultaneously form a first fin and a plurality of second fins on the substrate with the first spacer pattern and the second spacer patterns serving as an etching mask. At least one of the second fins is immediately next to the first fin, and a fin width of the first fin is larger than a fin width of the second fin. After forming the first fin and the second fins, the second fins are removed from the substrate.

According to an aspect of the present invention, another method for forming fin structures is provided. The method includes following steps. A substrate is provided. A first mandrel, a plurality of second mandrels, and a plurality of third mandrels are formed on the substrate simultaneously. A spacing width between the first mandrel and one of the second mandrels immediately next to the first mandrel is larger than a spacing width between the second mandrels. Next, a plurality of spacers are respectively formed on sidewalls of the first mandrel, the second mandrels, and the third mandrels and followed by removing the first mandrel, the second mandrels and the third mandrels to form a first spacer pattern, a plurality of second spacer patterns, and a plurality of third spacer patterns. Then, the substrate is etched to simultaneously form a first fin, a plurality of second fins, and a plurality of third fins on the substrate with the first spacer pattern, the second spacer patterns and the third spacer patterns serving as an etching mask. At least one of the second fins is immediately next to the first fin, and a fin width of the first fin is larger than a fin width of the second fins. After forming the first fin, the second fins and the third fins, the second fins are removed from the substrate.

According to the method for forming fin structures provide by the present invention, the fin width of the first fin is made larger than the fin width of the second fins because the spacing width between the first fin and the second fins is larger than the spacing width between the second fins. More important, since the second fins are removed, the first fin is taken as positioned in an iso region and thus suffers silicon loss during fabrication processing. However, because the first fin includes larger fin width, adverse impact due to silicon loss is mitigated, and eventually the fins required to include consistent fin width are obtained.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a method for forming fin structures provided by a first preferred embodiment of the present invention, wherein

FIGS. 8-14 are schematic drawings illustrating a method for forming fin structures provided by a second preferred embodiment of the present invention, wherein

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
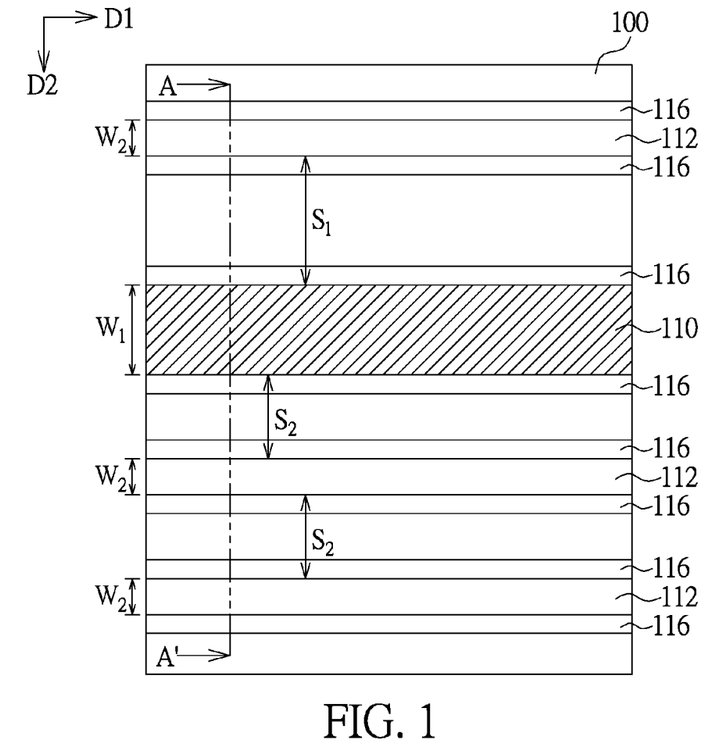
FIG. 1 is a schematic top view illustrating a step of the method for forming the fin structures.
Figure 2:
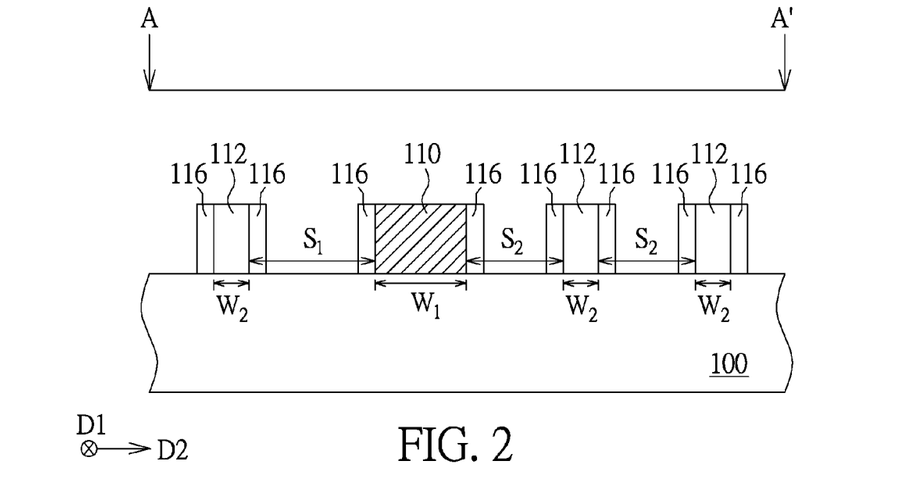
FIG. 2 is a cross-sectional view taken along a line A-A' of FIG. 1.

Please refer to FIG. 1-7, which are schematic drawings illustrating a method for forming fin structures provided by a first preferred embodiment of the present invention. In order to clearly describe the structure of the present invention, FIG. 1 and FIG. 2 should be referred together, FIG. 1 is a schematic top view illustrating a step of the method for forming the fin structure and FIG. 2 is a cross-sectional view taken along a line A-A' of FIG. 1. As shown in FIGS. 1 and 2, the preferred embodiment first provides a substrate 100, such as a silicon substrate. The substrate 100 can include any suitable substrate or lamination capable of accommodating semiconductor IC elements, for example but not limited to, the substrate 100 may be a silicon substrate. Alternatively, the substrate 100 may include another elementary semiconductor, such as germanium (Ge); a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof. In some embodiments of the present invention, the substrate 100 can include a silicon-on-insulator (hereinafter abbreviated as SOI) substrate or a bulk silicon substrate. It is well-known to those skilled in the art that a SOI substrate upwardly includes a silicon substrate, a bottom oxide (BOX) layer and a semiconductor layer such as a single crystalline silicon layer. The substrate 100 includes at least a hard mask layer (not shown). In some embodiments of the present invention, the hard mask layer can include a metal hard mask layer. For example but not limited to, the hard mask layer can include titanium nitride (TiN). In some embodiments of the present invention, the hard mask layer can be a multi-layered structure such as an oxide/nitride/oxide (ONO) layer, but not limited to this.

Please still refer to FIGS. 1 and 2. Next, a first mandrel 110 and a plurality of second mandrels 112 are simultaneously formed on the substrate 100. The mandrel patterns 110 and 112 can include polysilicon, but not limited to this. As shown in FIGS. 1 and 2, the first mandrel 110 and the second mandrels 112 are all extended along a first direction D1, and arranged along a second direction D2. And the first direction D1 is perpendicular to the second direction D2. Therefore the first mandrel 110 and the second mandrels 112 are parallel with each other. It is noteworthy that in the preferred embodiment, the first mandrel 110 includes a width $W_1$, the second mandrels 112 include a width $W_2$, and the width $W_1$ of the first mandrel 110 is larger than the width $W_2$ of the second mandrels 112. Furthermore, as shown in FIGS. 1 and 2, two second mandrels 112 are positioned at respective two sides of the first mandrel 110, and therefore there are two spacing widths $S_1$ and $S_2$ respectively defined between the second mandrels 112 and the first mandrel 110. More important, the spacing width $S_1$ is larger than spacing width $S_2$. According to the preferred embodiment the second mandrels 112 include the spacing width $S_2$ defined therebetween. Thus it is concluded that the spacing width $S_1$ between the first mandrel 110 and one of the second mandrel 112 that is immediately next to the first mandrel 110 on one side is larger than the spacing width $S_2$ between the second mandrels 112. In other words, the spacing width $S_2$ of the first mandrel 110 and one of the second mandrels 112 immediately next to the first mandrel 110 on the other side is the same with the spacing width $S_2$ between the second mandrels 112.

Please still refer to FIGS. 1 and 2. Next, a material layer such as an insulating layer, for example but not limited to, a silicon nitride (SiN) layer (not shown) formed by atomic layer deposition (ALD) or chemical vapor deposition (CVD), is blanketly formed on the substrate 100. However, those skilled in the art should understand other suitable material of which an etching rate is different from the first and second mandrels 110/112 can be used. Next, the material layer is etched back, and thus a plurality of spacers 116 are formed on sidewalls of the first mandrel 110 and the second mandrels 112.

Figure 3:
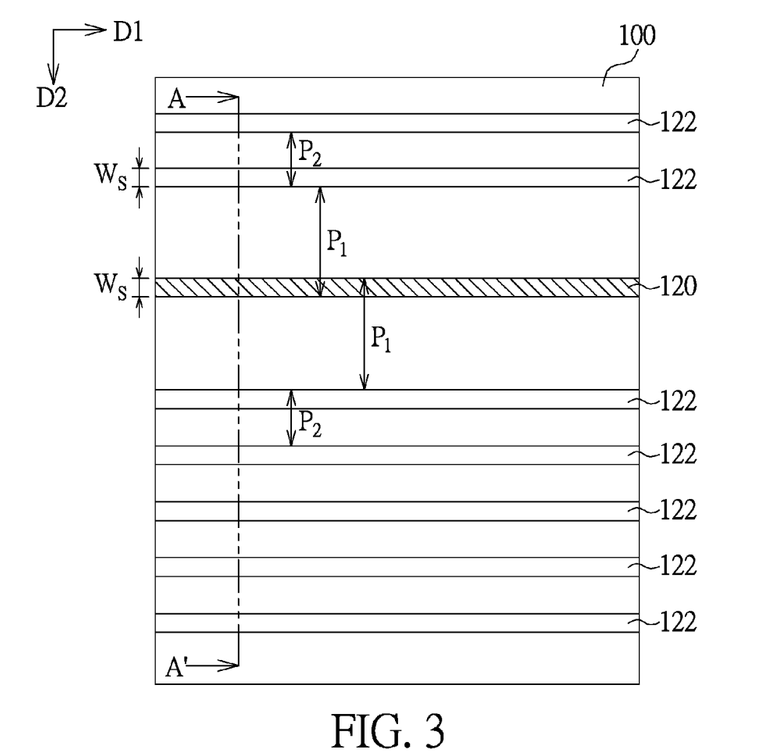
FIG. 3 is a schematic top view in a step subsequent to FIG. 1.
Figure 4:
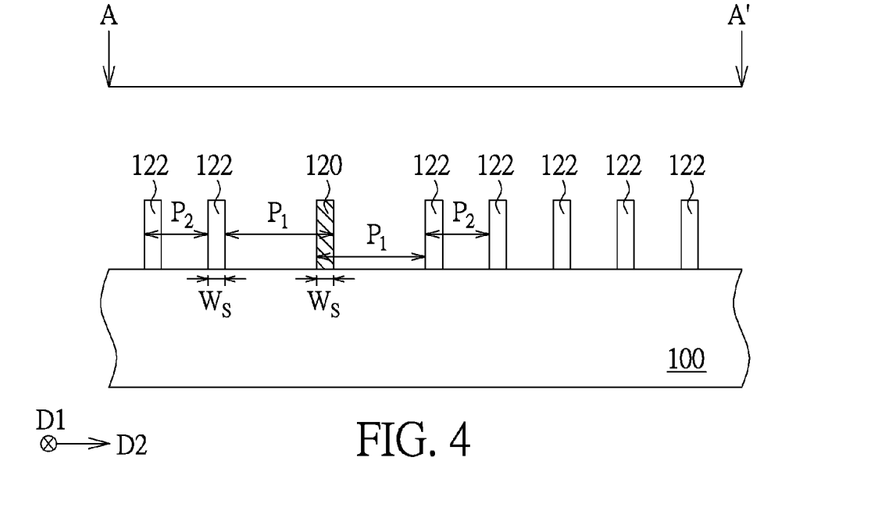
FIG. 4 is a cross-sectional view taken along a line A-A' of FIG. 3.

In order to clearly describe the structure of the present invention, FIG. 3 and FIG. 4 should be referred together, FIG. 3 is a schematic top view in a step subsequent to FIG. 1 and FIG. 4 is a cross-sectional view taken along a line A-A' of FIG. 3. As shown in FIGS. 3 and 4, the first mandrel 110 and the second mandrels 112 are then removed from the substrate 100. And thus a first spacer pattern 120 and a plurality of second spacer patterns 122 are formed on the substrate 100. The first spacer pattern 120 and the second spacer patterns 122 are used to define locations and sizes of fins to be formed. In the preferred embodiment, the first spacer pattern 120 defines a real fin while the second patterns 122 define dummy fins, but not limited to this. As shown in FIGS. 3 and 4, of the first spacer pattern 120 and the second spacer patterns 122 include a same width $W_S$. In some embodiments of the present invention, the width $W_S$ of the first spacer pattern 120 and the second spacer patterns 122 is equal to a fin width of fins (not shown) formed in other regions on the substrate 100, but not limited to this. It is noteworthy that a fin pitch is defined as the sum of the fin width plus the spacing width between two adjacent fins. Therefore, as shown in FIGS. 3 and 4, a fin pitch $P_1$ of the first spacer pattern 120 larger than a fin pitch $P_2$ of the second spacer patterns 122. In some embodiments of the present invention, the fin pitch $P_1$ of the first spacer pattern 120 is at least 1.5 times to the second fin pitch $P_2$ of the second spacer patterns 122. In some embodiments of the present invention, the fin pitch $P_1$ of the first spacer pattern 120 is preferably at least 2 times to the second fin pitch $P_2$ of the second spacer patterns 122 for simplifying pattern designing. Briefly speaking, the spaces between the first spacer pattern 120 and the second spacer patterns 122 are all larger than spaces between the second patterns 122.

Figure 5:
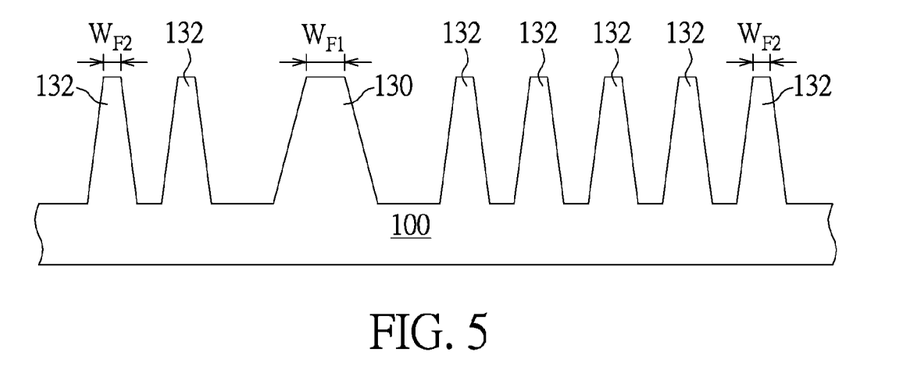
FIG. 5 is a schematic drawing in a step subsequent to FIG. 4.

Please refer to FIG. 5, which is a schematic drawing in a step subsequent to FIG. 4. Next, the first spacer pattern 120 and the second spacer patterns 122 are transferred to the hard mask layer and followed by performing an etching process with the first spacer pattern 120 and the second spacer patterns 122 serving as an etching mask. The etching process is performed to etch the substrate 100 to simultaneously format least a first fin 130 and a plurality of second fins 132 on the substrate 100. The first fin 130 and the second fins 132 are formed in the substrate 100 correspondingly to the first spacer pattern 120 and the second spacer patterns 122, respectively. Thus there are two second fins 132 formed immediately next to the first fin 130. The first fin 130 includes a fin width $W_{F1}$ and the second fins 132 include a fin width $W_{F2}$. It is noteworthy that because the first spacer pattern 120 includes larger spacing width as shown in FIGS. 3 and 4, the fin width $W_{F1}$ of the first fin 130 is automatically larger than the fin width $W_{F2}$ of the second fin 132 after the etching process.

Figure 6:
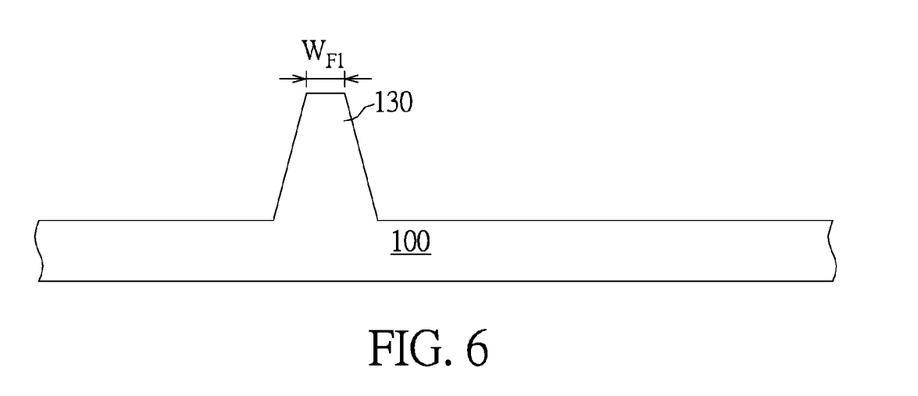
FIG. 6 is a schematic drawing in a step subsequent to FIG. 5.

Please refer to FIG. 6. In the preferred embodiment, the second fins 132 are defined as dummy fins. And thus after forming the first fin 130 and the second fins 132, the second fins 132 are all removed from the substrate 100. Consequently, a single fin, that is the first fin 130 is left on the substrate 100 as shown in FIG. 6. Furthermore, since the second fins (the dummy fins) 132 are all removed, the first fin (the single fin) 130 is taken as to be formed in an iso region, and other fins (not shown) are grouped and formed in a dense region. Additionally, the removal of the second fins 132 can be performed simultaneously with the fin cut step in the conventional processing, but not limited to this.

Figure 7:
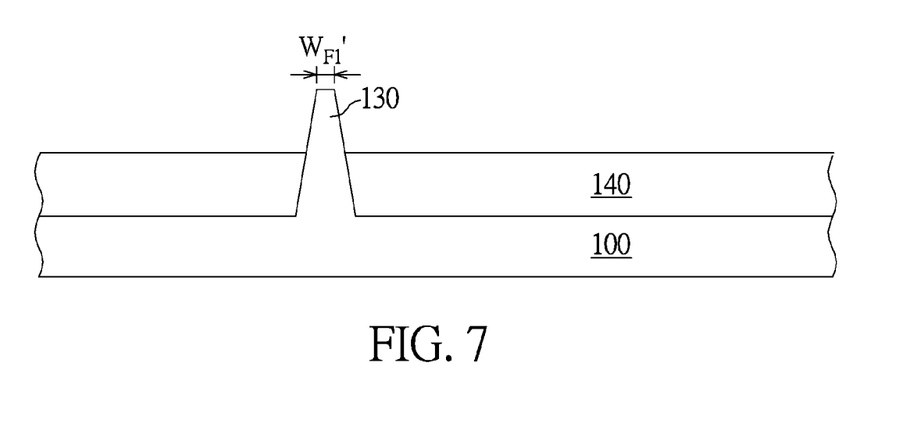
FIG. 7 is a schematic drawing in a step subsequent to FIG. 6.

Please refer to FIG. 7. After removing the second fins 132, a dielectric layer 140 is formed on the substrate 100. The dielectric layer 140 can be formed by performing a STI gap fill process, and thus the dielectric layer 140 can include insulating material such as silicon oxide. The silicon oxide may be formed by suitable oxidation and/or deposition methods. For example, this process may include a chemical vapor deposition (hereinafter abbreviated as CVD) process. The CVD process may be include plasma-enhanced CVD (PECVD), remote plasma-enhanced CVD (RPECVD), atomic-layer CVD (ALCVD). The CVD process may be either a low-pressure CVD (LPCVD) process or an ultrahigh vacuum CVD (UVCVD) process. In one exemplary configuration, the CVD process may include a flowable CVD (FCVD) process to deposit the oxide material using in-situ steam generated (ISSG) oxide and atomic layer deposition (ALD) oxide. It is noteworthy that during the STI gap fill process, thermal treatment such as steam anneal and/or rapid thermal processing (hereinafter abbreviated as RTP) is involved. More important, it is found the silicon material suffers Si loss during the thermal treatment and this problem is exacerbated in iso region(s). Therefore, the single first fin 130 obtains a reduced fin width $W_{F1}'$ after forming the dielectric layer 140. However, since the single first fin 130 formed in the iso region includes larger fin width, such Si loss renders no impact to device performance.

Please still refer to FIG. 7. After forming the dielectric layer 140, an etching back process can be performed to etch back the dielectric layer 140 and thus the first fin 130 is protruded from a surface of the dielectric layer 140 as shown in FIG. 7. Thereafter, a gate layer (not shown), which including a gate dielectric layer and a gate conductive layer, is formed on the first fin 130 and followed by other steps for forming FinFET. And those details are omitted in the interest of brevity.

According to the method for forming fin structures provide by the first preferred embodiment of the present invention, the fin width $W_{F1}$ of the first fin 130 is made larger than the fin width $W_{F2}$ of the second fins 132 because the spacing width between the first fin 130 and its adjacent second fins 132 is larger than the spacing width between the second fins 132. And as mentioned above, the larger spacing width between the first fin 130 and its adjacent second fins 132 are obtained by forming the wider first mandrel 110 with larger spacing width $S_1$ between the first mandrel 110 and one of the second mandrels 112 immediately next to the first mandrel 110. More important, since the second fins 132 are removed, the first fin 130 is taken as positioned in an iso region and thus suffers Si loss during fabrication processing. However, because the first fin 130 includes larger fin width $W_{F1}$, buffers for Si loss are provided. Consequently, adverse impact is mitigated.

Figure 8:
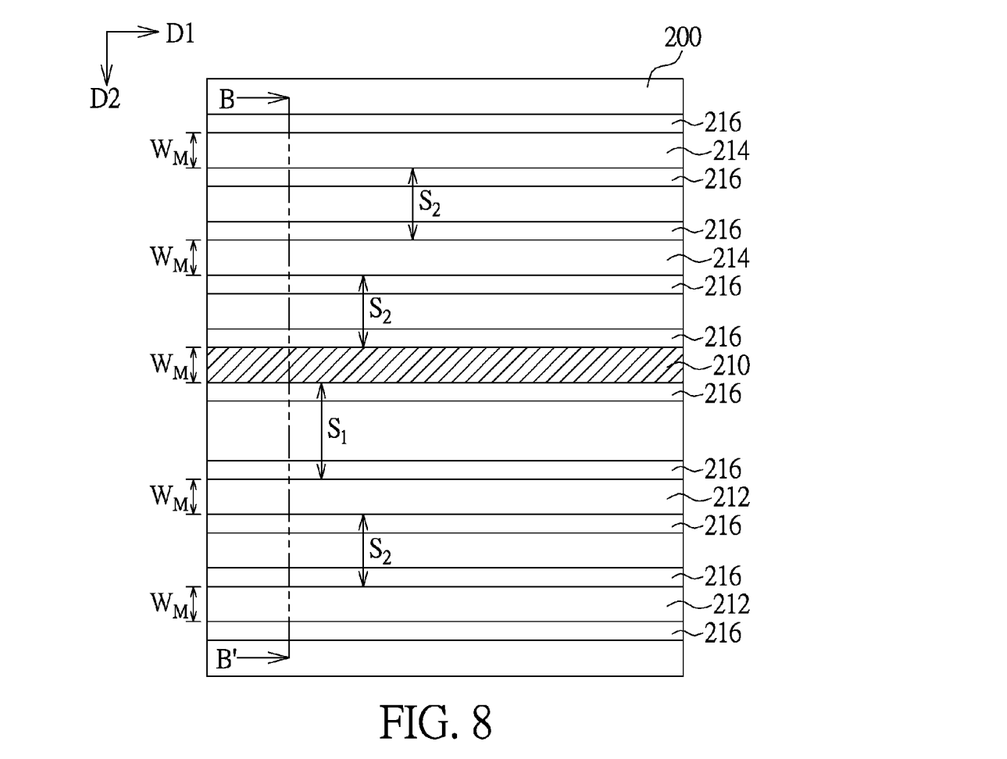
FIG. 8 is a schematic top view illustrating a step of the method for forming the fin structures.
Figure 9:
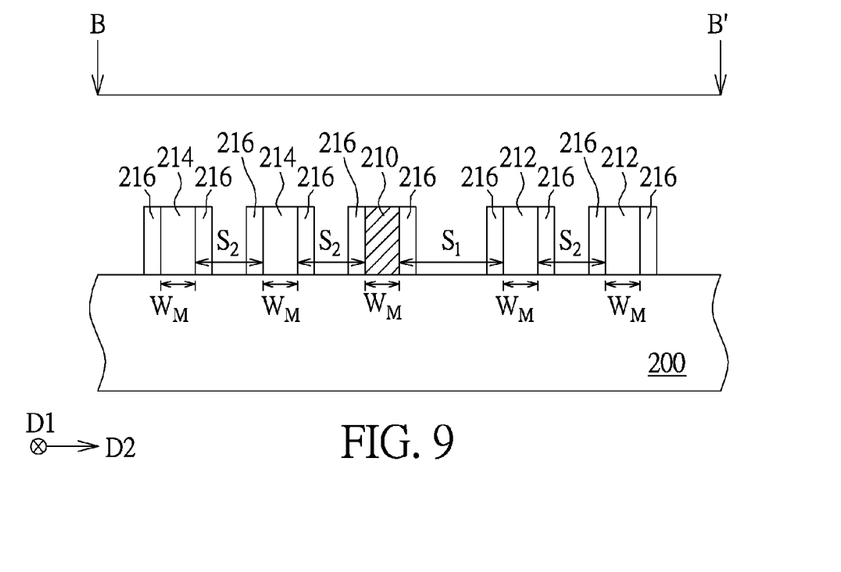
FIG. 9 is a cross-sectional view taken along a line B-B' of FIG. 8.

Please refer to FIG. 8-14, which are schematic drawings illustrating a method for forming fin structures provided by a second preferred embodiment of the present invention. It should be understood that elements the same in the first and second preferred embodiment can include a same material and thus those details are omitted for simplicity. In order to clearly describe the structure of the present invention, FIG. 8 and FIG. 9 should be referred together, FIG. 8 is a schematic top view illustrating a step of the method for forming the fin structure and FIG. 9 is a cross-sectional view taken along a line B-B' of FIG. 8. As shown in FIGS. 1 and 2, the preferred embodiment first provides a substrate 200. Next, a first mandrel 210, a plurality of second mandrels 212, and a plurality of third mandrels 214 are simultaneously formed on the substrate 200. As shown in FIGS. 8 and 9, the first mandrel 210, the second mandrels 212 and the third mandrels 214 are all extended along a first direction D1, and arranged along a second direction D2. And the first direction D1 is perpendicular to the second direction D2. Therefore the first mandrel 210, the second mandrels 212 and the third mandrels 214 are parallel with each other. It is noteworthy that in the preferred embodiment, the first mandrel 210 and the third mandrels 214 are formed in a region where circuits are to be formed while the second mandrels 212 are formed in a dummy region. More important, the mandrel formed nearest to a boundary of the region where circuits are to be formed is defined as the first mandrel 210. Furthermore, the second mandrels 212 are formed on one side of the first mandrel 210, and the third mandrels 214 are formed on the other side of the first mandrel 210. In other words, the second mandrels 212 are formed on a first side of the first mandrel 210 and the third mandrels 214 are formed on a second side of the first mandrel 210, and the second side is different from and opposite to the first side. The first mandrel 210, the second mandrels 212 and the third mandrels 214 all include a same width $W_M$. In other words, the width $W_M$ of the first mandrel 210 is the same with the width $W_M$ of the second mandrels 212, and the width $W_M$ of the third mandrels 214. As shown in FIGS. 8 and 9, one of the second mandrels 212 is positioned immediately next to the first mandrel 210, and one of the third mandrels 214 is positioned immediately next to the first mandrel 210. A spacing width $S_1$ is defined between the first mandrel 210 and the second mandrel 212 that is immediately next to the first mandrel 210, and a spacing width $S_2$ is defined between the first mandrel 210 and the third mandrel 214 that is immediately next to the first mandrel 210. And the spacing width $S_1$ is larger than spacing width $S_2$. In some embodiments of the present invention, the second mandrels 212 include the spacing width $S_2$ defined therebetween. In some embodiments of the present invention, the third mandrels 214 also include the spacing width $S_2$ defined therebetween. Thus it is concluded that the spacing width $S_1$ between the first mandrel 210 and the second mandrel 212 that is immediately next to the first mandrel 210 is larger than the spacing width $S_2$ between the second mandrels 212. And the spacing width $S_2$ between the first mandrel 210 and the third mandrel 214 immediately next to the first mandrel 210 on the other side is the same with the spacing width $S_2$ between the second mandrels 212 and the same with the spacing width $S_2$ between the third mandrels 214. Additionally, the spacing width $S_2$ between the third mandrels 214 is the same with the spacing width $S_2$ between the second mandrels 212.

Please still refer to FIGS. 8 and 9. Next, a material layer such as an insulating layer is blanketly formed on the substrate 200. However, those skilled in the art should understand other suitable material of which an etching rate is different from the mandrels 210/212/214 can be used. Next, the material layer is etched back, and thus a plurality of spacers 216 are formed on sidewalls of the first mandrel 210, the second mandrels 212 and the third mandrels 214.

Figure 10:
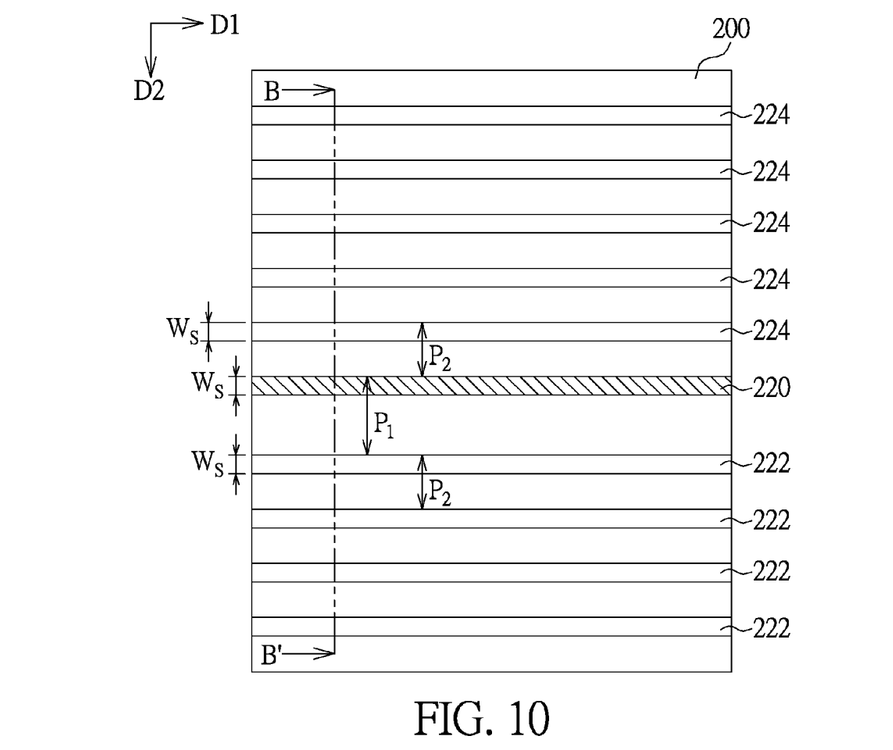
FIG. 10 is a schematic top view in a step subsequent to FIG. 8.
Figure 11:
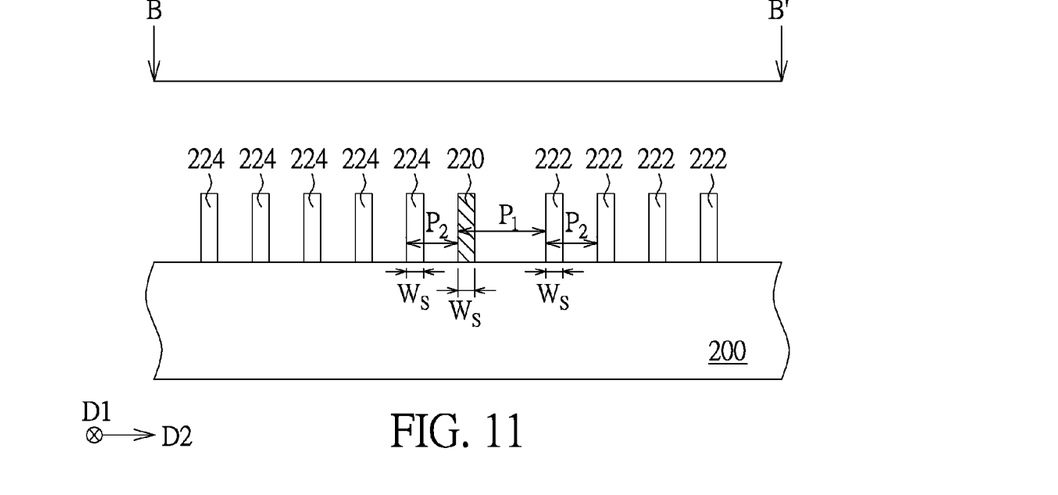
FIG. 11 is a cross-sectional view taken along a line B-B' of FIG. 10.

In order to clearly describe the structure of the present invention, FIG. 10 and FIG. 11 should be referred together, FIG. 10 is a schematic top view in a step subsequent to FIG. 8 and FIG. 11 is a cross-sectional view taken along a line B-B' of FIG. 10. As shown in FIGS. 10 and 11, the first mandrel 210, the second mandrels 212 and the third mandrels 214 are then removed from the substrate 200. And thus a first spacer pattern 220, a plurality of second spacer patterns 222 and a plurality of third spacer patterns 224 are formed on the substrate 200. The first spacer pattern 220, the second spacer patterns 222 and the third spacer patterns 224 are used to define locations and sizes of fins to be formed. It is noteworthy that in the preferred embodiment, the first spacer pattern 220 and the third spacer patterns 224 are formed in the region where circuits are to be formed while the second spacer patterns 222 are formed in a dummy region. The second spacer patterns 222 are formed on one side of the first spacer pattern 220, and the third spacer patterns 224 are formed on the other side of the first spacer pattern 220. In other words, the spacer pattern formed nearest to the boundary of the region where circuits are to be formed is defined as the first spacer pattern 220. As shown in FIGS. 10 and 11, a width $W_S$ of the first spacer pattern 220, the second spacer patterns 222 and the third spacer patterns 224 are the same. In some embodiments of the present invention, the width $W_S$ of the first spacer pattern 220, the second spacer patterns 222 and the third spacer patterns 224 is equal to a fin width of fins (not shown) formed in other regions on the substrate 200, but not limited to this. It is noteworthy that a fin pitch is defined as the sum of the fin width plus the spacing width between two adjacent fins. Therefore, as shown in FIGS. 10 and 11, a fin pitch $P_1$ of the first spacer pattern 220 is larger than a fin pitch $P_2$ of the second spacer patterns 222 and a fin pitch $P_2$ of the third spacer patterns 224. In some embodiments of the present invention, the fin pitch $P_1$ of the first spacer pattern 220 is at least 1.5 times to the second fin pitch $P_2$ of the second spacer patterns 222. In some embodiments of the present invention, the fin pitch $P_1$ of the first spacer pattern 220 is preferably at least 2 times to the second fin pitch $P_2$ of the second spacer patterns 222 for simplifying pattern designing. Briefly speaking, the space between the first spacer pattern 220 and the second spacer pattern 222 is larger than the space between the second patterns 222 itself, and is larger than the space between the first spacer pattern 220 and the third spacer 224.

Figure 12:
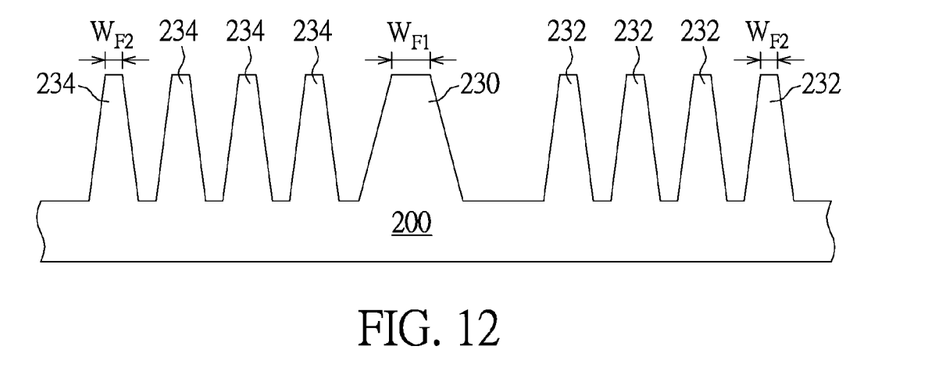
FIG. 12 is a schematic drawing in a step subsequent to FIG. 11.

Please refer to FIG. 12, which is a schematic drawing in a step subsequent to FIG. 11. Next, the first spacer pattern 220, the second spacer patterns 222 and the third spacer patterns 224 are transferred to the hard mask layer and followed by performing an etching process with the first spacer pattern 220, the second spacer patterns 222 and the third spacer patterns 224 serving as an etching mask. The etching process is performed to etch the substrate 200 to simultaneously form a first fin 230, a plurality of second fins 232 and a plurality of third fins 234 on the substrate 200. The first fin 230, the second fins 232 and the third fins 234 are formed in the substrate 200 correspondingly to the first spacer pattern 220, the second spacer patterns 222 and the third spacer patterns 224, respectively. Thus the second fins 232 are formed on one side of the first fin 230, and the third fins 234 are formed on the other side of the first fin 234 as shown in FIG. 12. Accordingly, one of the second fins 232 is formed immediately next to the first fin 230, and one of the third fins 234 is formed immediately next to the first fin 230. The first fin 230 includes a fin width $W_{F1}$, and the second fins 232 and the third fins 234 include a fin width $W_{F2}$. It is noteworthy that because the first spacer pattern 220 includes larger spacing width as shown in FIGS. 10 and 11, the fin width $W_{F1}$ of the first fin 230 is automatically larger than the fin width $W_{F2}$ of the second fins 232 and the third fins 234 after the etching process. In some embodiments of the present invention, the fin width $W_{F2}$ of the second fins 232 is the same with the fin width $W_{F2}$ of the third fins 234, but not limited to this.

Figure 13:
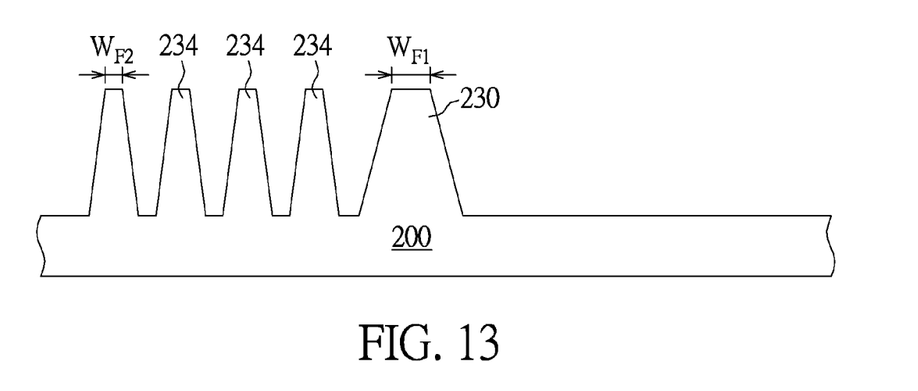
FIG. 13 is a schematic drawing in a step subsequent to FIG. 12.

Please refer to FIG. 13. In the preferred embodiment, the second fins 232 are defined as dummy fins. After forming the first fin 230, the second fins 232 and the third fins 234, the second fins 232 are all removed from the substrate 200. Consequently, the first fin 230 and the third fins 234 are left on the substrate 200 as shown in FIG. 13. It is noteworthy that though the first fin 230 and the third fins 234 are all formed in the region where the circuit to be formed, the first fin 230 is formed nearest to the boundary of that region and thus is defined as an outer fin, and the third fins 234 are defined as inner fins. Furthermore, since the second fins (the dummy fins) 232 are all removed, the first fin (the outer fin) 230 is taken as to be formed in an iso region, and the third fins (the inner fins) are taken as to be formed in a dense region. Additionally, the removal of the second fins 232 can be performed simultaneously with the fin cut step in the conventional processing, but not limited to this.

Figure 14:
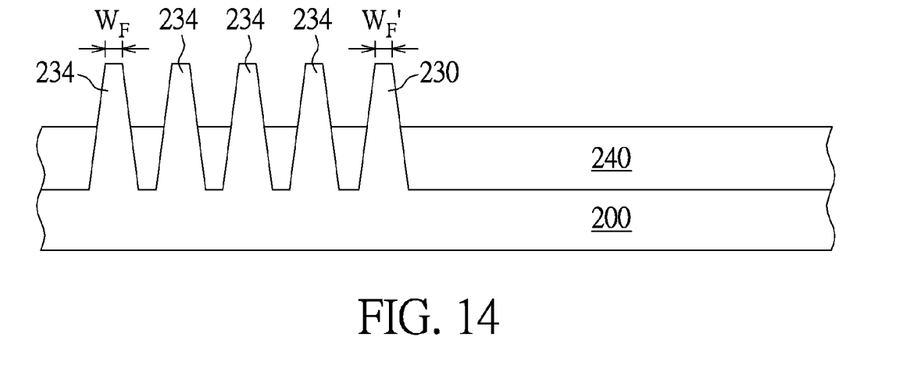
FIG. 14 is a schematic drawing in a step subsequent to FIG. 13.

Please refer to FIG. 14. After removing the second fins 232, a dielectric layer 240 is formed on the substrate 200. The dielectric layer 240 can be formed by performing a STI gap fill process and thus the dielectric layer 240 can include insulating material. It is noteworthy that during the STI gap fill process, thermal treatment such as steam anneal and/or RTP is involved. More important, it is found the silicon material suffers Si loss during the thermal treatment and this problem is exacerbated in the iso region(s). Therefore, the first fin 230 obtains a reduced fin width $W_{F1}'$. In some embodiments of the present invention, the reduced fin width $W_{F1}'$ of the first fin 230 after the thermal treatment is no less than the fin width $W_{F2}$ of the third fins 234. However, since the first fin 230 formed in the iso region includes larger fin width, such Si loss renders no impact to device performance.

Please still refer to FIG. 14. After forming the dielectric layer 240, an etching back process can be performed to etch back the dielectric layer 240 and thus the first fin 230 and the third fins 234 are protruded from a surface of the dielectric layer 240 as shown in FIG. 14. Thereafter, a gate layer (not shown), which including a gate dielectric layer and a gate conductive layer, is formed on the first fin 230 and the third fins 234, and followed by other steps for forming FinFET. And those details are omitted in the interest of brevity.

According to the method for forming fin structures provide by the second preferred embodiment of the present invention, the fin width $W_{F1}$ of the first fin 230 is made larger than the fin width $W_{F2}$ of the second fins 232 and the third fins 234 because the spacing width between the first fin 230 and the second fins 232 is larger than the spacing width between the second fins 232 and between the third fins 234. In other words, a maximum fin width of the first fin 230 is larger than a maximum fin width of the second fins 232. More important, since the second fins 232 are removed, the first fin 230 is taken as positioned in an iso region and thus suffers Si loss during fabrication processing. However, because the first fin 230 includes larger fin width $W_{F1}$, buffers for Si loss are provided. Consequently, adverse impact is mitigated.

According to the method for forming fin structures provide by the present invention, the fin width of the first fin (the single fin/the outer fin) is made larger than the fin width of the second fins (the dummy fins) and the third fins (the inner fins) because the spacing width between the first fin and the second fins is larger than the spacing width between the second fins and between the third fins. More important, since the second fins are removed, the first fin is taken as positioned in an iso region and thus suffers silicon loss during fabrication processing. However, because the first fin includes larger fin width, adverse impact due to silicon loss is mitigated, and eventually the fins (inner fins and the outer fin) required to include consistent fin width are obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming fin structures, comprising:
providing a substrate;
forming a first mandrel, a plurality of second mandrels, and a plurality of third mandrels on the substrate simultaneously, and a spacing width between the first mandrel and one of the second mandrels immediately next to the first mandrel being larger than a spacing width between the second mandrels, wherein the second mandrels are formed on a first side of the first mandrel and the third mandrels are formed on a second side of the first mandrel, and the second side is different from and opposite to the first side;
forming a plurality of spacers respectively on sidewalls of the first mandrel, the second mandrels, and the third mandrels;
removing the first mandrel, the second mandrels and the third mandrels to form a first spacer pattern, a plurality of second spacer patterns, and a plurality of third spacer patterns;
etching the substrate with the first spacer pattern, the second spacer patterns and the third spacer patterns serving as an etching mask to simultaneously form a first fin, a plurality of second fins, and a plurality of third fins on the substrate, at least one of the second fins being immediately next to the first fin, and a fin width of the first fin being larger than a fin width of the second fins; and
removing the second fins from the substrate, wherein a maximum fin width of the first fin is larger than a maximum fin width of the second fins.

2. The method for forming the fin structures according to claim 1, wherein a width of the first mandrel is the same with a width of the second mandrels, and a width of the third mandrels.

3. The method for forming the fin structures according to claim 1, wherein a spacing width between the first mandrel and one of the third mandrels immediately next to the first mandrel is the same with a spacing width between the third mandrels.

4. The method for forming the fin structures according to claim 3, wherein the spacing width between the third mandrels is the same with the spacing width between the second mandrels.

5. The method for forming the fin structures according to claim 1, wherein the second spacer patterns are formed on one side of the first spacer pattern and the third spacer patterns are formed on another side of the first spacer pattern.

6. The method for forming the fin structures according to claim 5, wherein a fin pitch of the first spacer pattern is larger than a fin pitch of the second spacer patterns and a fin pitch of the third spacer patterns.

7. The method for forming the fin structures according to claim 6, wherein the fin pitch of the first spacer pattern is at least 1.5 times to the fin pitch of the second spacer patterns.

8. The method for forming the fin structures according to claim 1, wherein the fin width of the first fin is larger than a fin width of the third fins.

9. The method for forming the fin structures according to claim 8, wherein the fin width of the third fins are the same with the fin width of the second fins.

10. The method for forming the fin structures according to claim 1, further comprising forming a dielectric layer on the substrate after removing the second fins.

\* \* \* \* \*